United States Patent [19]

Anagnostopoulos et al.

[11] Patent Number: 4,654,683
[45] Date of Patent: Mar. 31, 1987

[54] BLOOMING CONTROL IN CCD IMAGE SENSORS

[75] Inventors: Constantine Anagnostopoulos, Mendon, N.Y.; Marvin H. White, Bethlehem, Pa.

[73] Assignee: Eastman Kodak Company, Rochester, N.Y.

[21] Appl. No.: 768,788

[22] Filed: Aug. 23, 1985

[51] Int. Cl.⁴ ............... H01L 29/78; H01L 49/02; H01L 27/14
[52] U.S. Cl. ............................ 357/24; 357/6; 357/30
[58] Field of Search ............ 357/24 LR, 24 M, 23.5, 357/6, 30

[56] References Cited

U.S. PATENT DOCUMENTS

| | | | |
|---|---|---|---|
| 4,267,469 | 5/1981 | Ohba et al. | 307/3 |
| 4,373,167 | 2/1983 | Yamada | 357/357 |
| 4,467,341 | 8/1984 | Suzuki | 307/29 |
| 4,608,585 | 8/1986 | Keshtbod | 357/23.5 |

Primary Examiner—William D. Larkins
Assistant Examiner—Robert P. Limanek
Attorney, Agent, or Firm—Raymond L. Owens

[57] ABSTRACT

A CCD image sensor has a plurality of elements, each such sensing element includes a doped semiconductor substrate, an insulator layer over the semiconductor substrate, and an electrode on the insulator layer which when potential is applied to the electrode creates a well in the bulk of the substrate which collects charge as a result of a photoelectric process. The insulator layer has a thin portion selected so as to allow excess charge collected in the channel to tunnel through the thin region to the electrode and thereby prevent blooming.

4 Claims, 6 Drawing Figures

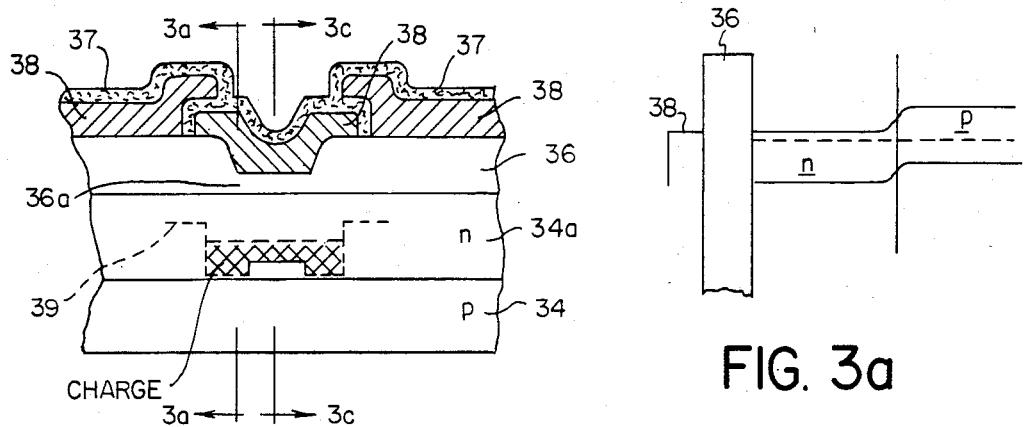
FIG. 2
FIG. 3a
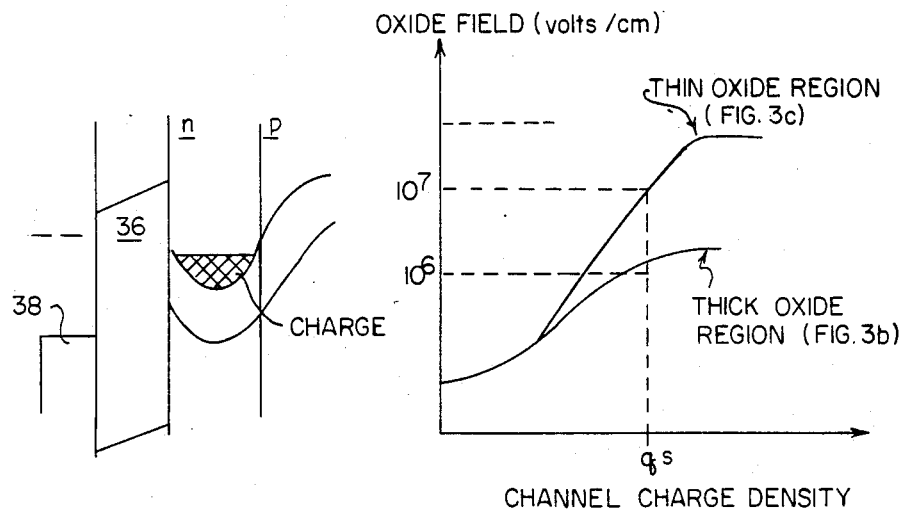
FIG. 3b
FIG. 4
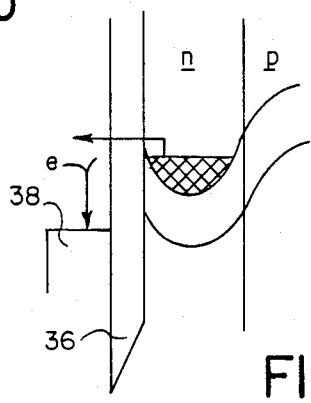
FIG. 3c

BLOOMING CONTROL IN CCD IMAGE SENSORS

FIELD OF THE INVENTION

This invention relates to CCD image sensors having a blooming control structure.

BACKGROUND OF THE PRIOR ART

One organization of area image sensor is known as the frame transfer organization. In this arrangement, charge transfer channels run in vertical directions. Separating each transfer channel is a channel stop which confines charge collected to the transfer channels and prevents charge leakage into adjacent channels. Each transfer channel has a plurality of sensing elements or image pixels. Each sensing element is defined by a plurality of closely spaced electrodes. The electrodes can be made from a transparent conductive material such as polysilicon. Potential is applied to at least one of the electrodes of each sensing element and a potential well or depletion region or well is formed under it. Charge is collected in the potential well which is a function of scene brightness. The potential well can either be what is referred to as a surface or a buried channel. In a buried channel situation, the electrodes are disposed on an insulator such as $SiO_2$. The insulator overlies the substrate. The substrate is doped and can be of a given polarity for example p-type. Near the insulator the substrate is of a polarity (n-type) opposite to that of the bulk substrate and of such a concentration that when a predetermined potential is applied to the electrode, a potential well or channel is formed within the substrate spaced from the insulator. Charge is collected in this channel which is a function of scene brightness. More specifically, carriers are produced by a photoelectric conversion process and collected in the channels. The problem with this arrangement is that when the array is illuminated by a scene in which certain regions are considerably brighter than other scene regions, the array portions receiving intense radiation may become overloaded and produce excess charge which tends to spread out throughout the channel. This spreading of charge will manifest itself as blooming of the image. Blooming causes the increase in size of a bright portion of an image and is a major limitation to the application of images to wide dynamic range sensors. In previous work, blooming caused by minimum exposure along a surface channel or along a very shallow buried channel device has been minimized by biasing the nonintegrating electrodes into an accumulation mode of operation. Another more common approach to blooming control consists of providing an overflow drain in the channel stops for collecting excess photogenerated carriers. This drain can consist of a region doped to the polarity opposite from the semiconductor substrate.

SUMMARY OF THE INVENTION

The object of this invention is to provide a CCD image sensor which effectively drains off excess charge carriers from a potential well to prevent blooming.

This object is achieved by apparatus for controlling blooming in a CCD image sensor having a plurality of elements with each such element including a doped semiconductor substrate, an insulator layer over the semiconductor substrate, and an electrode on the insulator layer which when potential is applied to it creates a well in the substrate which collects charge produced by a photoelectric process, characterized by: the insulator layer having a thin portion selected so as to allow excess charge collected in the well to tunnel through the thin portion to the electrode and thereby prevent blooming.

A feature of this invention is that an anti-blooming structure can be manufactured with a minimum of additional processing steps.

Another feature is the extensive overload capability without loss of resolution. In other words substantial over exposure will not cause significant image blooming.

A further feature is that blooming is prevented without the loss of sensor image area.

In still further feature is that CCD image area sensors in accordance with the invention have low sensitivity noise.

A still further feature is that blooming is prevented in CCD area image sensors without degradation in M.T.F.

DESCRIPTION OF THE DRAWINGS

FIG. 2 is a cross-sectional view taken along the lines 2—2 of FIG. 1 showing a sensor element in a transfer channel of the sensor;

FIGS. 3a and 3b respectively show energy band diagrams of a first region of the channel structure taken along lines 3a—3a of FIG. 2 and showing this region in unbiased and biased states, respectively, and FIG. 3c shows an energy band diagram of a second region of the channel structure taken along the lines 3c—3c of FIG. 2 and showing this region in a biased state; and FIG. 4 is a graph of the electric field in the oxide versus the signal charge density for the two regions.

DESCRIPTION OF THE PREFERRED EMBODIMENT

Figure 1:
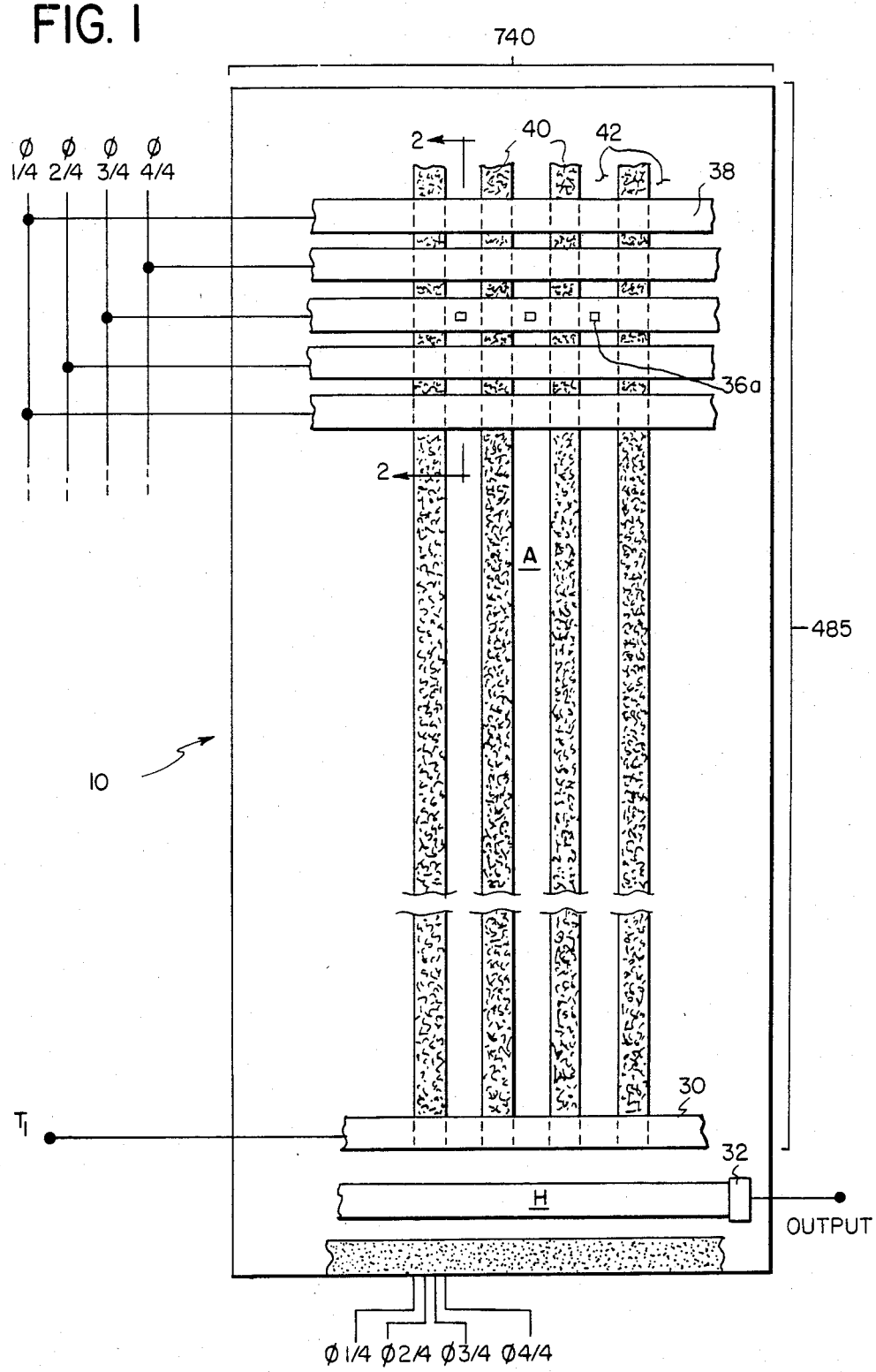
FIG. 1 is a schematic overall view of a frame transfer CCD area image sensor in accordance with the present invention showing in an exploded format elements of several transfer channels.

The overall configuration of a CCD area image sensor 10 which embodies the present invention is shown in FIG. 1. The image sensor 10 comprises a frame transfer four-phase (voltage lines $\phi1/4$–$\phi4/4$) buried channel CCD area image sensor. The image is sensed by sensing elements in each transfer channel 42. As will be described, each element is defined by a plurality of transparent electrodes. The elements define a staggered two-dimensional array A which for illustrative purposes only, is shown to have 740 columns and 485 rows of sensing elements. Each transparent electrode is connected to one line or phase of a four-phase clock signal. After exposure, the four clock signals on the voltage lines are sequentially applied in the well known manner to the image sensing array A to move the imagewise charge pattern formed in the sensing elements one row at a time to an output register shown as block H. Between adjacent transfer channels there are provided channel stops 40. These channel stops 40 may be provided by a thick field oxide and also by diffusion or implants.

High frequency clock pulses drive the polysilicon electrodes to read out each of the rows of the image sensor at the standard television video rate. The output register H is shown schematically as a block since it can be provided by a conventional four-phase CCD shift register positioned between a transfer gate 30 and a horizontal channel stop 44. Each cell of the output register H has four electrodes aligned with a transfer channel 42. These electrodes are actuated by signals on voltage lines $\phi 1/4$ through $\phi 4/4$ in the conventional manner.

The transfer gate electrode 30 is actuated by a first transfer signal $T_1$ and transfers a row of photocharges to the output register H.

After a row of photocharges has been transferred to the output register H, the transfer gate 30 is closed. By being closed is meant that a potential barrier is formed under this transfer electrode. At this time, the output register is operated in a four-phase manner, clocking the photocharge out to an output diode 32, one pixel at a time, which converts the photocharges into a voltage in the well known manner.

Turning now to FIG. 2, the CCD sensor is shown to be constructed on a silicon semiconductor substrate 34. A silicon dioxide ($SiO_2$) insulating layer 36 overlies the substrate 34. Silicon dioxide has the fundamental property of preventing the diffusion of impurities through it and is an excellent insulator. Polysilicon conductive electrodes 38 are deposited on top of the silicon dioxide layer 36. Metal conductive layers can also be used. Silicon dioxide layer 36 and the electrodes 38 are transparent and permit photons of visible light to pass through them into the bulk substrate 34. A thin protective layer 37 of silicon dioxide overcoats the electrodes 38. The bulk of the substrate 34 has been doped to be a p-type substrate. A suitable p-type dopant is boron. An n-type layer 34a has been diffused into the bulk substrate. Suitable n-type materials can be arsenic or phosphorus.

FIG. 3a shows an unbiased energy band diagram for a first channel region taken along the lines 3a—3a of FIG. 2. FIG. 3b shows the energy band diagram for the same region when the electrode 38 has been suitably positively biased. As shown in FIG. 2, in a central portion 36a of a sensing element, the insulator region is much thinner and this changes the energy band diagram for the second channel region. FIG. 3c shows the energy band diagram for this second region when the electrode 38 has the same positive potential as shown applied in FIG. 3b. The exact shape of the energy band diagrams depends primarily upon the doping levels of the various layers, the substrate doping, the dielectric constant and thickness of the insulator 36, and the voltage applied to the electrode 38. Once these parameters are known, the energy band diagram can be obtained by solution of Poisson's equation.

As noted above, layer 34a of the substrate adjacent to insulating layer 36 is of an n-type polarity, opposite to that of the bulk of the substrate. When a positive potential is applied to electrode 38, as shown in FIG. 3b, the energy band diagrams bend in a roughly parabolic manner and form a channel or well for collecting charge which is spaced from the surface of the insulator layer 36. The charge is produced by a photoelectric process as a result of exposure of light from a scene. This is usually referred to as a buried channel or well. The exact location of this channel depends upon the doping profiles and the applied voltages. In FIG. 2 the channel is shown by dotted lines 39. A buried channel is often preferable over a surface channel since it is not subject to charge transfer inefficiencies caused by charge interacting with surface states. It should be understood that although the present invention is particularly suitable with buried channel devices, it may also be applicable with surface channel CCD area image sensors.

Negative charge accumulates in the channel during exposure. Since the electrodes are transparent, scene light passes through them and photons of light are absorbed and free electrons are collected in the channel. These electrons are free to move about but cannot penetrate the potential walls of the channel. However, if the channel should become overloaded with excess charge, the charge can spill out into adjacent sensing element wells and cause blooming. We will shortly discuss how this invention prevents blooming from taking place. FIG. 3b shows the energy band diagram for the first channel region when the charge is in the channel and has not reached a sufficient level to spill out. FIG. 3c also shows for the second channel region that the voltage drops across the insulator is greatest in the thin region. This facilitates tunneling.

The energy bands for each sensing element can now be changed by varying the voltage on the lines $\phi 1/4 - \phi 4/4$ so as to shift the charge down into the horizontal readout register H. Thereafter the charge in register H is sequentially shifted to the diode 32 which converts the charge into a voltage.

The charge transfer channel 40 and the shift register H are standard charge transfer arrangements wherein by properly applying periodic voltages to their electrodes a moving array of potential wells can be formed in which charge is shifted from one position to another. The operation of these types of charge transfer devices is well known in the art and described fully in the textbook CHARGE TRANSFER DEVICES by Sequin et al. Pages 23–25 describe the operation of a conventional four-phase CCD electrode structure.

As shown in FIGS. 1 and 2, the thin-oxide portion 36a is centrally located under the electrode. When the channel under portion 36a builds up to a point where excess charge is beginning to accumulate, the thickness of the silicon dioxide layer 36 in the portion 36a is selected so that excess electrons tunnel into the conduction band of the silicon dioxide layer 36. The spatial location of the portion 36a is selected so that it can effectively remove the excess charge but not impede the subsequent transfer of the photocharge down to the register H.

FIG. 4 is a representative graph which explains the tunneling phenomenon. When the potential well has a charge level $q_s$ which is the maximum the well can hold, the field through the thick portion of the insulating layer 36 may, for example, be in the range of about $10^6$ V/cm whereas at the same time in the thin region the field is much greater and can say be about $10^7$ V/cm. At such a field strength, the so-called Fowler-Nordheim tunneling can take place into the conduction band of the $SiO_2$. As shown in FIG. 3c in the thin region there is a greater voltage drop across the thin portion 36a. Thus with the same charge density there is established different fields in the thick and thin oxides. With the appropriate selection of design parameters, the tunneling field in the thin oxide can be reached when the charge handling capacity of the storage well is just exceeded. The excess charge "e" then becomes a surface charge which tunnels into the conduction band of the insulator. The excess charge is removed from the storage region through the gate electrode 38 which reduces the electric field across the insulator and inhibits further tunneling. Thus the structure has a built-in or adaptive feature to substantially limit the charge flow only to the excess charge in the channel and thereby serves as an effective anti-blooming device.

The thin oxide insulator region 36a in a CCD creates a potential barrier and not a potential well. This is desirable since excess charge can be removed providing the dimensions of the tunneling region are minimized with respect to the channel width.

We claim:

1. A CCD image area sensor including a plurality of transfer electrodes arranged in sequence, means for applying phase-related voltages to said plurality of transfer electrodes to cause charge to be transferred sequentially between potential wells underlying said transfer electrodes, said image sensor having a plurality of sensing elements, each such sensing element including a doped semiconductor substrate, an insulator layer over the semiconductor substrate and an electrode on the insulator layer which when a potential is applied to it creates a potential well in the bulk of the substrate which collects charge produced by a photoelectric process, characterized by: the insulator having a thin portion selected so as to allow excess charge collected in the well to tunnel through the thin portion to the electrode and thereby prevent blooming.

2. In a CCD image area sensor including a plurality of transfer electrodes arranged in sequence, means for applying phase-related voltages to said plurality of transfer electrodes to cause charge to be transferred sequentially between potential wells underlying said transfer electrodes, said image sensor having a substrate and an insulator overlying the substrate and an electrode overlying the insulator which when a potential is applied to the electrode forms a potential well in the substrate, the improvement comprising: a portion of the insulating layer being formed thin enough so that when excess charge is collected in the potential well the field through the thin portion is increased to the extent that such excess charge can tunnel into the conduction band of the insulator and out through the electrode to thereby prevent blooming.

3. The invention as set forth in claim 2 wherein such insulating layer is silicon dioxide and wherein the substrate is doped such that a layer of the substrate adjacent to the insulating layer has a plurality opposite to that of the substrate bulk.

4. A CCD image area sensor including a plurality of transfer electrodes arranged in sequence, means for applying phase-related voltages to said plurality of transfer electrodes to cause charge to be transferred sequentially between potential wells underlying said transfer electrodes, said image sensor having a plurality of sensing elements, each such sensing element including a doped semiconductor substate, an insulator layer over the semiconductor substrate, and an electrode on the insulator layer which when a potential is applied to it creates a potential well in the bulk of the substrate which collects charge produced by a photoelectric conversion process, characterized by the insulator layer having two regions of different thicknesses selected such that when the well collects excess charge, a sufficient high field is formed only in the region of the insulator layer where the layer is thinner so that the excess charge tunnels into the conduction band of the insulator and out through the electrode to prevent blooming.

* * * * *